(12) United States Patent
Miura et al.

(10) Patent No.: US 12,359,130 B2
(45) Date of Patent: Jul. 15, 2025

(54) FLAME RETARDANT POWDER FOR MAGNETIC MEMBER, AND POLYMER COMPOSITION

(71) Applicant: Sanyo Special Steel Co., Ltd., Himeji (JP)

(72) Inventors: Kodai Miura, Himeji (JP); Toshiyuki Sawada, Himeji (JP); Ryosuke Ochi, Himeji (JP)

(73) Assignee: Sanyo Special Steel Co., Ltd., Himeji (JP)

( * ) Notice: Subject to any disclaimer, the term of this patent is extended or adjusted under 35 U.S.C. 154(b) by 813 days.

(21) Appl. No.: 17/424,225

(22) PCT Filed: Dec. 17, 2019

(86) PCT No.: PCT/JP2019/049422
§ 371 (c)(1),
(2) Date: Jul. 20, 2021

(87) PCT Pub. No.: WO2020/153050
PCT Pub. Date: Jul. 30, 2020

(65) Prior Publication Data
US 2022/0119713 A1    Apr. 21, 2022

(30) Foreign Application Priority Data
Jan. 21, 2019    (JP) ................. 2019-007663

(51) Int. Cl.
| | | |
|---|---|---|
| *C09K 21/02* | (2006.01) | |
| *C08K 3/016* | (2018.01) | |
| *C08K 3/11* | (2018.01) | |
| *C08L 101/00* | (2006.01) | |
| *C22C 38/02* | (2006.01) | |

(52) U.S. Cl.
CPC .............. *C09K 21/02* (2013.01); *C08K 3/016* (2018.01); *C08K 3/11* (2018.01); *C08L 101/00* (2013.01); *C22C 38/02* (2013.01); *C22C 2202/02* (2013.01)

(58) Field of Classification Search
None
See application file for complete search history.

(56) References Cited

U.S. PATENT DOCUMENTS

2013/0298730 A1    11/2013    Keda et al.

FOREIGN PATENT DOCUMENTS

| EP | 2063489 A1 | | 5/2009 |
|---|---|---|---|
| JP | 05195168 A | * | 8/1993 |
| JP | 2001332413 A | | 11/2001 |
| JP | 2002343618 A | | 11/2002 |
| JP | 2005236219 A | | 9/2005 |
| JP | 2005353686 A | | 12/2005 |
| JP | 2006147959 A | | 6/2006 |
| JP | 201129678 A | | 2/2011 |
| JP | 2011222897 A | | 11/2011 |
| JP | 2012104765 A | | 5/2012 |
| JP | 2012191192 A | | 10/2012 |
| JP | 2018127647 A | | 8/2018 |
| JP | 2018170330 A | | 11/2018 |
| JP | 2018186212 | * | 11/2018 |
| WO | 2008020574 A1 | | 2/2008 |

* cited by examiner

*Primary Examiner* — Tanisha Diggs
(74) *Attorney, Agent, or Firm* — The Webb Law Firm

(57) ABSTRACT

Provided is a powder which has a high saturation magnetic flux density and excellent flame retardancy. This powder is a flame retardant powder for a magnetic member, and includes a plurality of flaky particles. These particles are composed of an Fe—Si-based alloy containing 7% by mass or more and 12% by mass or less of Si. The content of Si in terms of percentage by mass, P(Si), in this alloy and the flame retardancy parameter $P_{NF}$ satisfy the following mathematical formulae (I) and (II): $(-0.97 \times P(Si)+13.0) < P_{NF} \le 10$ (I), $P_{NF} = D50 \times TD/\rho$ (II), wherein, D50 represents the median diameter of the powder, TD represents the tap density of the powder, and ρ represents the true density of the powder.

2 Claims, 1 Drawing Sheet

FLAME RETARDANT POWDER FOR MAGNETIC MEMBER, AND POLYMER COMPOSITION

CROSS-REFERENCE TO RELATED APPLICATIONS

This application is the United States national phase of International Application No. PCT/JP2019/049422 filed Dec. 17, 2019, and claims priority to Japanese Patent Application No. 2019-007663 filed Jan. 21, 2019, the disclosures of which are hereby incorporated by reference in their entirety.

BACKGROUND OF THE INVENTION

Field of the Invention

The present invention relates to a flame retardant powder and a polymer composition for magnetic members. More specifically, the present invention relates to powder to be dispersed in a member, such as an electromagnetic wave-absorbing sheet, and a polymer composition comprising the powder.

Description of Related Art

Electronic devices, such as personal computers and mobile phones, have circuits. Due to a radio wave noise radiated from electronic components mounted on this circuit, radio wave interference between the electronic components and also radio wave interference between the electronic circuits occur. Radio wave interference causes malfunction of the electronic devices. For the purpose of inhibiting malfunction, an electromagnetic wave-absorbing sheet is incorporated into the electronic device.

In information communication in recent years, the communication speed has been increased. High-frequency radio waves are used for this high-speed communication. Therefore, an electromagnetic wave-absorbing sheet suitable for use in the high frequency range has been desired.

Heat generated by electronic components causes a temperature inside an electronic device to rise. Therefore, the electromagnetic wave-absorbing sheet needs to be flame retardant.

Patent Literature 1 (JP2001-332413A) discloses a composite magnetic material comprising metal powder, a flame retardant, and a base resin. This metal powder is composed of an Fe—Cr—Si alloy.

Patent Literature 2 (JP2005-353686A) discloses a radio wave absorber comprising an organic matrix, powder dispersed in the matrix, and a flame retardant. This powder is composed of an Fe—Si—Cr based alloy or an Fe—Al—Si based alloy.

Patent Literature 3 (JP2018-170330A) discloses magnetic powder composed of an Fe—Si—Cr based alloy and magnetic powder composed of an Fe—Al—Si based alloy. The particles of these powders have oxide films. This oxide film can contribute to flame retardancy.

CITATION LIST

Patent Literature

Patent Literature 1: JP2001-332413A
Patent Literature 2: JP2005-353686A
Patent Literature 3: JP2018-170330A

SUMMARY OF INVENTION

When magnetic powder is used in a high frequency range, magnetic permeability is impaired by a magnetic resonance phenomenon. Therefore, this powder is required to have a high saturation magnetic flux density. The saturation magnetic flux density of the conventional flame retardant powder is not sufficient.

An object of the present invention is to provide a powder for magnetic members, the powder having a high saturation magnetic flux density and excellent flame retardancy.

The flame retardant powder for magnetic members according to an aspect of the present invention comprises a plurality (or multiple) of flaky particles. These particles are each composed of an Fe—Si based alloy comprising 7% by mass or more and 12% by mass or less of Si. A content of Si in terms of percentage by mass, P(Si), in this alloy and a flame retardancy parameter, $P_{NF}$, satisfy the following mathematical formulae (I) and (II):

$$(-0.97 \times P(Si) + 13.0) < P_{NF} \leq 10 \qquad (I)$$

$$P_{NF} = D50 \times TD/\rho \qquad (II)$$

wherein D50 represents a median diameter of the powder, TD represents a tap density of the powder, and $\rho$ represents a true density of the powder.

Preferably, the flame retardant powder has a saturation magnetic flux density of 1.3 T or more.

The polymer composition for magnetic members according to another aspect of the present invention comprises a base polymer and a flame retardant powder dispersed in the base polymer. This flame retardant powder comprises a plurality of (a large number of) flaky particles. These particles are each composed of an Fe—Si based alloy comprising 7% by mass or more and 12% by mass or less of Si. A content of Si in terms of percentage by mass, P(Si), in this alloy and a flame retardancy parameter, $P_{NF}$, in the powder satisfy the following mathematical formulae (I) and (II):

$$(-0.97 \times P(Si) + 13.0) < P_{NF} \leq 10 \qquad (I)$$

$$P_{NF} = D50 \times TD/\rho \qquad (II)$$

wherein D50 represents a median diameter of the powder, TD represents a tap density of the powder, and $\rho$ represents a true density of the powder.

The saturation magnetic flux density of the powder according to the present invention is large. Moreover, this powder is excellent in flame retardancy.

DESCRIPTION OF THE INVENTION

The present invention will be described in detail below by way of preferred embodiments while referring the drawings as appropriate.

[Particle Shape]

Figure 1:
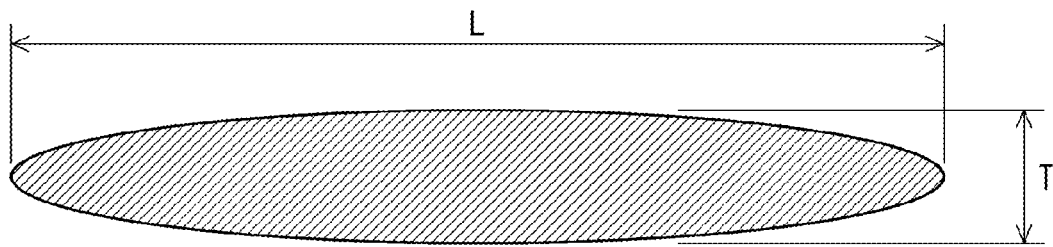
FIG. 1 is a schematic cross-sectional view of a particle of the flame retardant powder according to one embodiment of the present invention.

The flame retardant powder according to the present invention is an aggregate of a plurality of or a large number of particles. FIG. 1 shows a cross section of one particle. In FIG. 1, reference character L indicates the length of the major axis of the particle, and reference character T indicates the thickness of the particle. The length L is larger than the thickness T. In other words, the particle is flat.

The aspect ratio of this powder is preferably 1.5 or more and 100 or less. In a magnetic member including the powder having an aspect ratio of 1.5 or more, the real magnetic permeability $\mu'$ and the imaginary magnetic permeability $\mu''$ in a high frequency range are sufficiently large. In view of this, the aspect ratio is particularly preferably 5 or more. In a magnetic member including the powder having an aspect ratio of 100 or less, the sections where the powders come into contact with each other are reduced, and the loss due to an eddy current is inhibited. In view of this, the aspect ratio is particularly preferably 80 or less.

For measurement of the aspect ratio, a resin embedded sample is used, on which a thickness direction of the flaky powder can be observed. The sample is polished, and the polished surface is observed under a scanning electron microscope (SEM). The magnification of the image upon observation is ×500. In this image analysis, image data are binarized. By this analysis, the aspect ratio of each particle is measured, and these data are arithmetically averaged to calculate the aspect ratio of the powder. The aspect ratio of each particle is "length L of major axis/length T of minor axis" when the binarized image is approximated to an ellipse.

[Composition]

The present inventors added various elements to Fe and evaluated the flame retardancy and the saturation magnetic flux density of the resultant. The results are shown in Table 1 below.

[Table 1]

TABLE 1

| Flame retardancy and saturation magnetic flux density | | | | | | |
|---|---|---|---|---|---|---|
| Composition mass % | D50 μm | TD g/cm³ | ρ g/cm³ | $P_{NF}$ | Flame retardancy | Bs T |
| Fe—3Si | 51.5 | 0.9 | 7.6 | 6.1 | B | 1.83 |
| Fe—6.5Si | 58.7 | 0.9 | 7.3 | 7.4 | A | 1.58 |
| Fe—2.9Si—6.3Cr | 57.6 | 0.9 | 7.3 | 7.2 | B | 1.72 |
| Fe—2.8Si—11Mo | 60.6 | 0.9 | 7.6 | 7.4 | B | 1.51 |
| Fe—2.5Si—19W | 60.6 | 1.1 | 8.3 | 8.0 | B | 1.43 |
| Fe—2.9Si—6.2V | 58.8 | 0.9 | 7.2 | 7.5 | B | 1.66 |
| Fe—2.9Si—7.1Co | 65.9 | 0.9 | 7.4 | 8.3 | B | 1.91 |
| Fe—3Si—3.4Al | 55.9 | 0.9 | 6.9 | 7.3 | A | 1.56 |

From the results in Table 1, it was found that Si and Al contribute to the flame retardancy more than Cr, Mo, W, V, and Co. Furthermore, it was found that when the atomic percentages are the same, Si contributed to the saturation magnetic flux density more than Al. Based on the results in Table 1, the present inventors selected Si as an alloy element of the particles.

The particle is composed of an Fe—Si based alloy. An oxide film having a composition of $SiO_2$ is formed on the surface of the particle comprising Si. This oxide film inhibits contact between Fe and oxygen, and thus inhibits an oxidation reaction of Fe. Powder comprising the particles having these oxide films is excellent in flame retardancy. Powder comprising Si further has low magneto crystalline anisotropy, a low magnetostriction constant, and low coercive force. In view of these, the content of Si is preferably 7% by mass or more and particularly preferably 8% by mass or more. The saturation magnetic flux density of the powder comprising an excess of Si is low. In view of the saturation magnetic flux density, the content of Si is preferably 12% by mass or less, more preferably 11% by mass or less, and particularly preferably 10% by mass or less.

The remaining portion of this alloy when excluding Si is preferably Fe and unavoidable impurities.

[Flame Retardancy Parameter]

Herein, the flame retardancy parameter $P_{NF}$ is calculated according to the following mathematical formula (II):

$$P_{NF} = D50 \times TD/\rho \quad (II)$$

In this mathematical formula (II), D50 represents a median diameter of the powder, TD represents a tap density of the powder, and ρ represents a true density of the powder. The true density is measured with a dry density meter (manufactured by SHIMADZU CORPORATION, model AccuPyc 1330).

This parameter $P_{NF}$ satisfies the following mathematical formula (I):

$$(-0.97 \times P(Si) + 13.0) < P_{NF} \leq 10 \quad (I)$$

In this mathematical formula, P (Si) is a content of Si, in terms of percentage by mass, in the Fe—Si based alloy.

The powder having a parameter $P_{NF}$ larger than the value of $(-0.97 \times P(Si) + 13.0)$ is excellent in flame retardancy. In view of this, the parameter $P_{NF}$ is more preferably a value of $(-0.97 \times P(Si) + 14.5)$ or more and particularly preferably a value of $(-0.97 \times P(Si) + 15.0)$ or more. From the powder having a parameter $P_{NF}$ of 10 or less, a magnetic member that is homogeneous and has a smooth surface can be obtained. In view of this, the parameter $P_{NF}$ is more preferably 8 or less and particularly preferably 6 or less.

[Saturation Magnetic Flux Density Bs]

In powder with a large saturation magnetic flux density Bs, a magnetic resonance phenomenon occurs in a high frequency range. In view of this, the saturation magnetic flux density Bs of powder is preferably 1.3 T or more, more preferably 1.4 T or more, and particularly preferably 1.5 T or more. The saturation magnetic flux density Bs is preferably 2.0 T or less.

The saturation magnetic flux density Bs is measured with a vibrating sample magnetometer (VSM). The measurement conditions are as follows.
Maximum magnetic field applied: 1204 kA/m
Mass of powder: about 70 mg
Coercive Force Hc]

Powder with large coercive force Hc has a high magnetic resonance frequency. In view of this, the coercive force Hc of powder is preferably 500 A/m or more, more preferably 550 A/m or more, and particularly preferably 600 A/m or more. The coercive force Hc is preferably 1600 A/m or less.

The coercive force is the strength of an external magnetic field required to return a magnetized magnetic material to an unmagnetized state. The coercive force can be measured by, for example, a coercive force meter "HC801" manufactured by Qumano. The maximum magnetic field applied upon measurement is 144 kA/m.

[Median Diameter D50]

In view of flame retardancy, the median diameter D50 of powder is preferably 20 μm or more, more preferably 25 μm or more, and particularly preferably 30 μm or more. In view of obtaining a magnetic member that is homogeneous and has a smooth surface, the median diameter D50 is preferably 90 μm or less, more preferably 80 μm or less, and particularly preferably 70 μm or less.

The median diameter D50 is a particle diameter at the point where the cumulative volume reaches 50% in the cumulative curve wherein the total volume of powder is regarded as 100%. The median diameter D50 is measured by, for example, a laser diffraction/scattering particle-size distribution analyzer "Microtrac MT3000" manufactured by NIKKISO CO., LTD. The powder is poured into a cell of this apparatus together with pure water, and the median diameter D50 is detected based on the light scattering information of the particles.

[Tap Density TD]

In view of flame retardancy, the tap density TD of the powder is preferably 0.6 g/cm³ or more, more preferably 0.7 g/cm³ or more, and particularly preferably 0.8 g/cm³ or more. In view of obtaining a magnetic member that is homogeneous and has a smooth surface, the tap density TD is preferably 1.7 g/cm³ or less, more preferably 1.5 g/cm³ or less, and particularly preferably 1.3 g/cm³ or less.

The tap density TD is measured in accordance with the provisions of "JIS Z 2512". In the measurement, about 20 g of the powder is filled into a cylinder having a volume of 100 cm³. The measurement conditions are as follows.

Drop height: 10 mm
Number of taps: 200

[Powder Production]

The powder according to the present invention is obtained by subjecting raw material powder to a flattening process. The raw material powder can be obtained by a gas atomizing method, a water atomizing method, a disc atomizing method, a pulverization method, etc. The gas atomizing method and the disc atomizing method are preferred.

In the gas atomization method, a raw material metal is heated and melted to obtain a molten metal. This molten metal flows out of the nozzle. Gas (argon gas, nitrogen gas, etc.) is sprayed onto this molten metal. Due to the energy of this gas, the molten metal is pulverized into droplets, which are cooled while being dropped. The droplets solidify to form particles. In this gas atomizing method, the molten metal is instantaneously formed into droplets and cooled at the same time, so that homogeneous fine structures can be obtained. Moreover, since droplets are continuously formed, the difference in the composition between the particles is extremely small.

In the disc atomizing method, the raw material metal is heated and melted to obtain a molten metal. This molten metal flows out of the nozzle. This molten metal is dropped onto a disk that rotates at a high speed. The molten metal is rapidly cooled and solidified to obtain particles.

The raw material powder is subjected to a flattening process. A typical flattening process is carried out with an attritor.

The raw material powder can be obtained by classification. The raw material powder is subjected to heat treatment as needed. The flaky powder is subjected to treatment such as heat treatment and classification as needed.

[Forming of Magnetic Members]

In order to obtain a magnetic member from this powder, the powder is first kneaded with a base polymer such as a resin and rubber to obtain a polymer composition. Known methods can be adopted for the kneading. For example, the kneading can be carried out by a closed kneader, an open roll, etc.

Next, a magnetic member is formed from this polymer composition. Known methods can be adopted for the forming. The forming can be carried out by compression molding, injection molding, an extrusion molding, rolling, etc. A shape of a typical magnetic member is a sheet shape. The magnetic member may have another shape such as a ring shape, a cubic shape, a rectangular parallelepiped shape, or a cylindrical shape. The magnetic member comprising the powder according to the present invention is particularly suitable for use in a frequency range of 300 MHz or more.

Various chemicals can be kneaded into the base polymer together with the powder. Examples of the chemicals include processing aids, such as lubricants and binders. The polymer composition may include a flame retardant. It is not necessary to add a large amount of a flame retardant because the powder contributes to flame retardancy.

EXAMPLES

Effects of the present invention will be clarified by Examples below, but the present invention should not be construed in a limited manner based on the description of these Examples.

Example 1

The powder of Example 1 having the composition shown in Table 2 below was produced by the gas atomizing, classification, and a flattening process by a wet attritor. The median diameter D50, tap density TD, flame retardancy parameter $P_{NF}$, saturation magnetic flux density Bs, and coercive force Hc of this powder are shown in Table 2 below.

Examples 2 to 5 and Comparative Examples 1 to 5

The powders of Examples 2 to 5 and Comparative Examples 1 to 5 were each produced in the same manner as in Example 1 except that the composition was as shown in Table 2 below.

[Evaluation of Flame Retardancy]

It was determined by a small gas flame ignition test whether or not powder falls under the Category II, type 1 flammable solid under the Fire Service Act. The evaluation criteria are as follows:

A: Powder is not rated as B below.
B: Powder ignites within 3 seconds and continues burning.

Powder rated as A is considered not to be a type 1 flammable solid. Powder rated as B is considered to be a type 1 flammable solid. The results are shown in Table 2 below.

TABLE 2

| | Component composition | P(Si) mass % | D50 μm | TD g/cm³ | ρ g/cm³ | $P_{NF}$ | -0.97 * P(Si) + 13.0 | Formula (I) | Bs T | Hc (major axis direction) A/m | Flame retardancy |
|---|---|---|---|---|---|---|---|---|---|---|---|
| Comp. Ex. 1 | Fe | 0.0 | 92.4 | 0.9 | 7.8 | 10.6 | 13.0 | Unsatisfied | 1.95 | 1050 | B |
| Comp. Ex. 2 | Fe—3Si | 3.0 | 40.2 | 1.1 | 7.6 | 5.9 | 10.1 | Unsatisfied | 1.74 | 1170 | B |

TABLE 2-continued

Evaluation results

|  | Component composition | P(Si) mass % | D50 μm | TD g/cm$^3$ | ρ g/cm$^3$ | $P_{NF}$ | −0.97 * P(Si) + 13.0 | Formula (I) | Bs T | Hc (major axis direction) A/m | Flame retardancy |
|---|---|---|---|---|---|---|---|---|---|---|---|
| Comp. Ex. 3 | Fe—6.5Si | 6.5 | 51.7 | 0.9 | 7.3 | 6.2 | 6.7 | Unsatisfied | 1.58 | 796 | B |
| Ex. 1 | Fe—8Si | 8.0 | 47.4 | 1.4 | 7.3 | 8.8 | 5.2 | Satisfied | 1.52 | 826 | A |
| Ex. 2 | Fe—9Si | 9.0 | 74.1 | 0.9 | 7.3 | 9.2 | 4.3 | Satisfied | 1.53 | 828 | A |
| Ex. 3 | Fe—10Si | 10.0 | 37.7 | 0.8 | 7.2 | 4.3 | 3.3 | Satisfied | 1.42 | 891 | A |
| Ex. 4 | Fe—11Si | 11.0 | 39.6 | 0.9 | 7.1 | 5.2 | 2.3 | Satisfied | 1.35 | 812 | A |
| Ex. 5 | Fe—12Si | 12.0 | 35.6 | 1.2 | 7.0 | 5.9 | 1.4 | Satisfied | 1.32 | 1012 | A |
| Comp. Ex. 4 | Fe—13Si | 13.0 | 32.6 | 1.1 | 7.0 | 5.3 | 0.4 | Satisfied | 1.27 | 1166 | A |
| Comp. Ex. 5 | Fe—12Si | 12.0 | 8.0 | 0.8 | 7.0 | 1.0 | 1.4 | Unsatisfied | 1.32 | 2448 | B |

Figure 2:
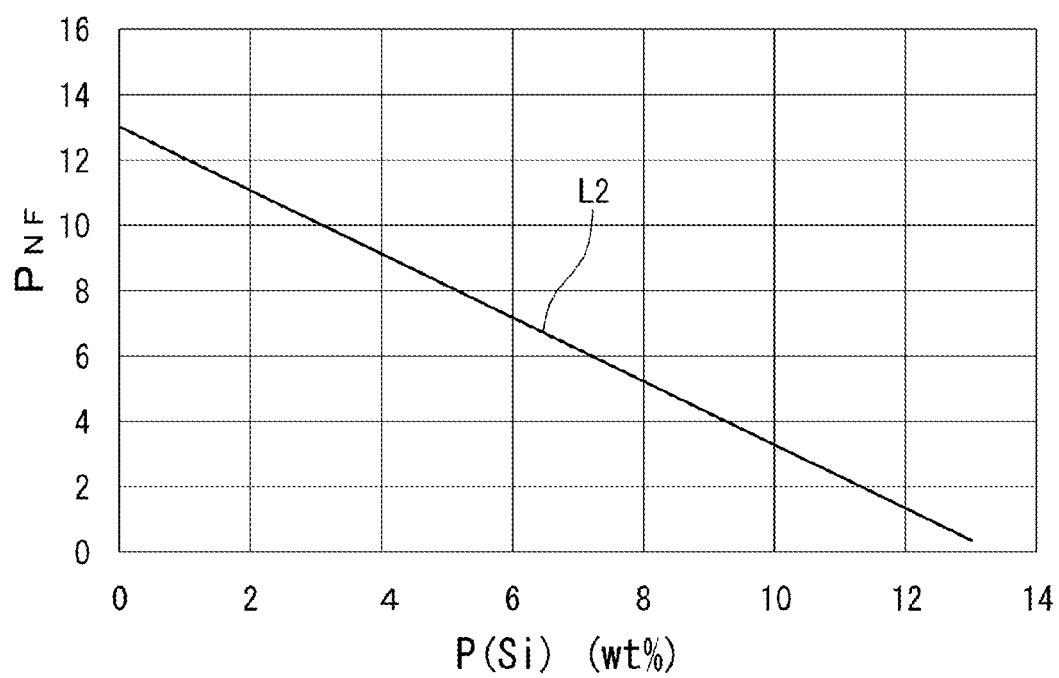
FIG. 2 is a graph illustrating relationship between a content of Si in the flame retardant powder and a flame retardancy parameter.

The equation of the straight line L2 shown in the graph of FIG. 2 is $$P_{NF} = -0.97 \times P(Si) + 13.0$$

The points of the powders of Examples 1 to 5 are located above the straight line L2 in this graph. In other words, the powders of Examples 1 to 5 fulfill the following mathematical formula:

$$(-0.97 \times P(Si) + 13.0) < P_{NF}$$

From this evaluation result, the superiority of the present invention is clear.

The powder according to the present invention is suitable for various magnetic members.

The invention claimed is:

1. A flame retardant powder for magnetic members, comprising a plurality of flaky particles,
wherein the flaky particle is composed of an Fe—Si based alloy comprising 7% by mass or more and 12% by mass or less of Si, and a content of Si in terms of percentage by mass, P(Si), in the alloy and a flame retardancy parameter, $P_{NF}$, satisfy following mathematical formulae (I) and (II):

$$(-0.97 \times P(Si) + 13.0) < P_{NF} \leq 10 \tag{I}$$

$$P_{NF} = D50 \times TD/\rho \tag{II}$$

wherein D50 represents a median diameter of the powder, TD represents a tap density of the powder, and ρ represents a true density of the powder, wherein the flame retardant powder has a saturation magnetic flux density of 1.3 T or more,
wherein the flame retardant powder has a coercive force Hc of 550 A/m or more, and
wherein the tap density TD of the flame retardant powder is 0.6 g/cm$^3$ or more and 1.7 g/cm$^3$ or less.

2. A polymer composition for magnetic members, comprising a base polymer and a flame retardant powder dispersed in the base polymer,
wherein the flame retardant powder comprises a plurality of flaky particles, the flaky particle is composed of an Fe—Si based alloy comprising 7% by mass or more and 12% by mass or less of Si, and a content of Si in terms of percentage by mass, P (Si), in the alloy and a flame retardancy parameter, $P_{NF}$, in the powder satisfy following mathematical formulae (I) and (II):

$$(-0.97 \times P(Si) + 13.0) < P_{NF} \leq 10 \tag{I}$$

$$P_{NF} = D50 \times TD/\rho \tag{II}$$

wherein D50 represents a median diameter of the powder, TD represents a tap density of the powder, and ρ represents a true density of the powder,
wherein the flame retardant powder has a saturation magnetic flux density of 1.3 T or more,
wherein the flame retardant powder has a coercive force Hc of 550 A/m or more, and
wherein the tap density TD of the flame retardant powder is 0.6 g/cm$^3$ or more and 1.7 g/cm$^3$ or less.

* * * * *